United States Patent
Andreas

(10) Patent No.: US 6,627,550 B2
(45) Date of Patent: Sep. 30, 2003

(54) POST-PLANARIZATION CLEAN-UP

(75) Inventor: Michael T. Andreas, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/818,751

(22) Filed: Mar. 27, 2001

(65) Prior Publication Data

US 2002/0142584 A1 Oct. 3, 2002

(51) Int. Cl.⁷ .............................................. H01L 21/461
(52) U.S. Cl. ....................................... 438/691; 438/692
(58) Field of Search ................................. 438/690–693

(56) References Cited

U.S. PATENT DOCUMENTS

| | | |
|---|---|---|
| 4,180,422 A | 12/1979 | Rosvold |
| 4,332,687 A | 6/1982 | Daignault et al. |
| 5,696,035 A | 12/1997 | Kitano |
| 5,858,813 A | 1/1999 | Scherber et al. |
| 5,894,852 A | 4/1999 | Gonzales et al. |
| 5,897,375 A | 4/1999 | Watts et al. |
| 5,963,814 A | 10/1999 | Walker et al. |
| 5,968,280 A | 10/1999 | Ronay |
| 5,972,124 A | 10/1999 | Sethuraman et al. |
| 6,044,851 A | 4/2000 | Grieger et al. |
| 6,046,110 A * | 4/2000 | Hirabayashi et al. ......... 216/88 |
| 6,077,785 A | 6/2000 | Andreas |
| 6,090,214 A | 7/2000 | Zhou et al. |
| 6,099,662 A | 8/2000 | Wang et al. |
| 6,110,830 A | 8/2000 | Skrovan et al. |
| 6,117,783 A | 9/2000 | Small et al. |
| 6,121,143 A | 9/2000 | Messner et al. |
| 6,124,207 A | 9/2000 | Robinson et al. |
| 6,126,853 A | 10/2000 | Kaufman et al. |
| 6,143,705 A | 11/2000 | Kakizawa et al. |
| 6,147,002 A | 11/2000 | Kneer |
| 6,152,148 A | 11/2000 | George et al. |
| 6,153,935 A | 11/2000 | Edelstein et al. |
| 6,156,661 A | 12/2000 | Small |
| 6,158,445 A | 12/2000 | Olesen et al. |
| 6,265,781 B1 | 7/2001 | Andreas |
| 6,274,059 B1 * | 8/2001 | Krusell et al. ............... 134/1.3 |
| 6,329,284 B2 * | 12/2001 | Maekawa ................... 438/633 |

FOREIGN PATENT DOCUMENTS

| | | |
|---|---|---|
| EP | 0 913 442 | 5/1999 |
| FR | 2 722 511 | 1/1996 |
| JP | 52 045550 | 4/1977 |
| JP | 11233405 | 8/1999 |
| JP | 11354513 | 12/1999 |
| WO | WO 01/24234 | 4/2001 |

* cited by examiner

Primary Examiner—Jey Tsai
(74) Attorney, Agent, or Firm—Leffert Jay & Polglaze, P.A.

(57) ABSTRACT

Cleaning solutions and methods for removing residuals from the surface of an integrated circuit device. Such solutions and methods find particular application in the fabrication of a dual damascene structure following removal of excess portions of a silver-containing metal layer from a device surface. The cleaning solutions and methods facilitate removal of particulate residuals as well as unremoved portions of the metal layer in a single cleaning process. The cleaning solutions are dilute aqueous solutions containing hydrogen peroxide and at least one acidic component and are substantially free of particulate material. Acidic components include carboxylic acids and their salts.

31 Claims, 2 Drawing Sheets

POST-PLANARIZATION CLEAN-UP

TECHNICAL FIELD OF THE INVENTION

The present invention relates generally to cleaning surface layers in integrated circuit fabrication, and in particular to the development of cleaning solutions and methods for the removal of abrasive particles and other residuals from integrated circuit surface layers.

BACKGROUND OF THE INVENTION

Chemical-mechanical planarization ("CMP") processes are frequently used to planarize the surface layers of a wafer or other substrate in the production of ultra-high density integrated circuits. In typical CMP processes, a wafer is pressed against a slurry on a polishing pad under controlled conditions. Slurry solutions generally contain small, abrasive particles that mechanically remove the surface layer of the wafer. Slurry solutions may further contain chemicals that assist the removal process. The polishing pad is generally a planar pad made from a relatively soft, porous material, such as blown polyurethane. The wafer is abraded by the abrasive particles, thereby leveling or planarizing the surface of the wafer. After the wafer is planarized, it is cleaned to remove residual particles on the surface of the wafer that were introduced to the CMP process by the slurry, the polishing pad or the wafer itself. As an alternative to slurry solutions, the abrasive particles may be carried by the pad itself.

CMP processing is particularly useful for planarizing a metallic surface layer used to form conductive features, such as interlayer connectors and/or conducting lines. As an example, these interconnects are often formed by a method known as a dual damascene technique. Using the dual damascene technique, contact vias and conductor trenches are patterned into an insulating layer of a semiconductor wafer and a layer of metal is formed over this structure. This blanket layer of metal fills the vias and trenches and covers the upper surface of the wafer. Excess metal formed on the upper surface of the wafer is then removed by CMP to a level at or below the surface of the insulating layer.

After the excess metal is removed, residual materials from the slurry, polishing pad or wafer remain on the planarized surface of the wafer. The residual materials commonly include particles attracted to the surface of the wafer, such as by electrostatic or mechanical forces, as well as material bonded to the surface of the wafer. Residual materials attracted to the surface of the wafer may include abrasive particles from the slurry and particles of the metal layer removed from the surface of the wafer. Residual materials bonded to the surface of the wafer may include any remaining excess metal not removed during the planarization. To reduce defects in the finished integrated circuit device, it is generally necessary to clean such residual materials from the planarized surface of the wafer prior to further processing.

A common post-CMP cleaning approach is to use a slurry dispersant to first remove the materials attracted to the surface of the wafer. Slurry dispersants may include deionized (DI) water to simply flush such residuals from the surface of the wafer. Mechanical action, such as brush scrubbing or megasonics, may assist the removal of these attracted residuals. The slurry dispersant may also include materials to complex or otherwise bind such residuals to aid in their removal.

After removal of the materials attracted to the surface of the wafer, the wafer is often etched to remove the material bonded to the surface of the wafer. Such residuals generally are unaffected by slurry dispersants. As these residuals are typically remaining patches of the conductor material, their removal is also important to proper device performance.

In these two-step approaches, the appropriate slurry dispersants and etchants are highly dependent upon their respective target residual materials. Often, the slurry dispersants and etchants may be incompatible with each other, thus requiring a cleaning step to remove traces of the slurry dispersant before etching the bonded residuals. Each processing step creates added cost and the opportunity for introducing additional defects into the integrated circuit device.

In the competitive semiconductor industry, it is desirable to maximize the yield of finished wafers. The uniformity of the planarized surface and maximization of yield is, in part, a function of the effectiveness and repeatability of the solutions and processes used for the removal of residuals following CMP. While a wide variety of dispersant and etchant solutions are available, these solutions are generally specific to the composition of the material to be removed. One must also avoid damaging the surrounding materials.

As device sizes continue to decrease, designers must turn to higher-conductivity materials for use in interconnect lines and contacts to replace aluminum and its alloys. Some of these higher-conductivity materials include silver and its alloys.

For the reasons stated above, and for other reasons stated below that will become apparent to those skilled in the art upon reading and understanding the present specification, there is a need in the art for alternative solutions and methods for removing planarization residuals in the fabrication of integrated circuit devices, particularly following mechanical removal of a silver-containing layer.

SUMMARY

Cleaning solutions and methods for removing residuals from the surface of an integrated circuit device are described herein. Such solutions and methods find particular application in the fabrication of a dual damascene structure following removal of excess portions of a silver-containing metal layer from a device surface. The cleaning solutions and methods facilitate removal of particulate residuals as well as unremoved portions of the metal layer in a single cleaning process. The cleaning solutions are dilute aqueous solutions containing hydrogen peroxide and at least one acidic component and are substantially free of particulate material. Acidic components include carboxylic acids and their salts.

For one embodiment, the invention provides a method of removing residuals from a surface of an integrated circuit device following mechanical removal of a metal layer. The method includes contacting the surface of the integrated circuit device with a clean aqueous solution containing hydrogen peroxide and at least one acidic component selected from the group consisting of carboxylic acids and their salts. For a further embodiment, the carboxylic acids are hydroxy acids.

For another embodiment, the invention provides a method of removing residuals from a surface of an integrated circuit device following mechanical removal of a silver-containing metal layer. The method includes contacting the surface of the integrated circuit device with an acidic aqueous solution consisting essentially of hydrogen peroxide, water and at least one acidic component. Each acidic component is either a carboxylic acid or a salt of a carboxylic acid. For a further embodiment, the carboxylic acids are hydroxy acids.

For yet another embodiment, the invention provides a method of removing residuals from a surface of an integrated circuit device following mechanical removal of a silver-containing metal layer. The method includes contacting the surface of the integrated circuit device with a solution consisting essentially of hydrogen peroxide, water and an ammonium salt of a hydroxy acid. For a further embodiment, the ammonium salt of a hydroxy acid, is an ammonium salt of citric acid.

For one embodiment, the invention provides a method of fabricating an integrated circuit device. The method includes forming a metal layer on a patterned insulating layer, mechanically removing a portion of the metal layer from the surface of the patterned insulating layer, and contacting the surface of the patterned insulating layer with a clean solution, thereby removing at least a portion of any residuals from the surface of the patterned insulating layer. The solution contains hydrogen peroxide, an aqueous solvent and at least one acidic component selected from the group consisting of carboxylic acids and their salts.

For another embodiment, the invention provides a post-planarization cleaning solution. The cleaning solution contains hydrogen peroxide, an aqueous solvent and at least one acidic component selected from the group consisting of carboxylic acids and their salts. For a further embodiment, the salts of the carboxylic acids are ammonium salts of the carboxylic acids. For a still further embodiment, each acidic component is either acetic acid, citric acid, lactic acid, malic acid, an acetate, a citrate, a lactate or a malate.

Further embodiments of the invention include solutions and methods of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

FIGS. 1A–1E are cross-sectional views of a portion of an integrated circuit device 100 at various stages of fabrication.

Figure 1A:
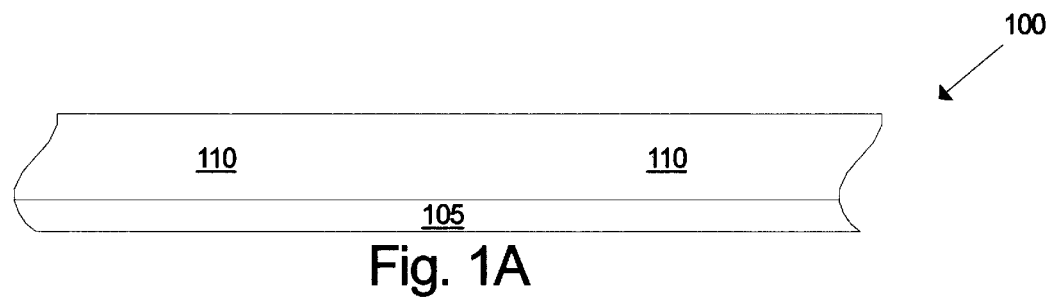
FIGS. 1A–1E are cross-sectional views of a portion of an integrated circuit device at various stages of fabrication in accordance with an embodiment of the invention.

In FIG. 1A, an insulating layer 110 is formed on a substrate 105. Substrate 105 may be a silicon substrate, such as a p-type monocrystalline silicon substrate. Insulating layer 110 generally contains an insulator or dielectric material, such as a silicon oxide ($SiO/SiO_2$), silicon nitride ($SiN/Si_2N/Si_3N_4$) or silicon oxynitride ($SiO_xN_y$) material. For one embodiment, the dielectric layer 110 contains a doped silicon oxide material, such as borophosphosilicate glass (BPSG), a boron- and phosphorous-doped silicon dioxide material. For another embodiment, the dielectric layer 10 contains a germanium selenide material ($GeSe/GeSe_2$). Additional embodiments can include other dielectric glass and glass-like materials.

Figure 1B:
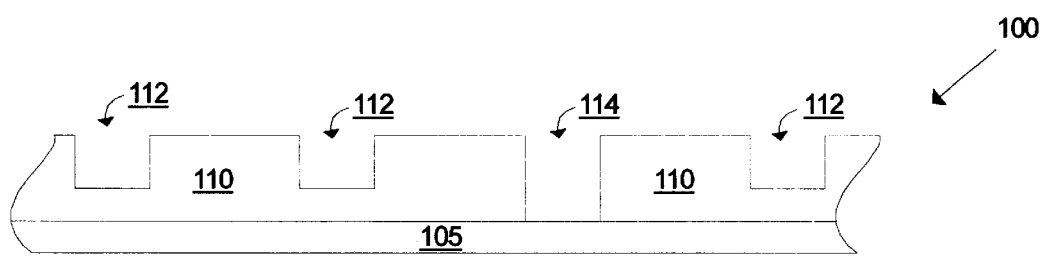

In FIG. 1B, the insulating layer 110 is patterned to define apertures such as trenches 112 and vias 114. Patterning of the insulating layer 110 may include conventional photolithographic techniques to mask portions of the insulating layer 110 and to expose portions of the insulating layer 110 where future trenches 112 and vias 114 are to be formed. The exposed portions of the insulating layer 110 are then removed. The portions of the insulating layer 110 may be removed by etching or other suitable removal technique known in the art. Removal techniques are generally dependent upon the material of construction of the layer to be removed as well as the surrounding or underlying layers to be retained.

Due to the nature of the dual damascene process, the depth of the etch is variable across the surface of the substrate, e.g., the etch depth is greater where vias 114 are defined and less where only trenches 112 are defined. Thus, two mask and etch steps can be utilized in a conventional photolithographic process to define the vias 114 separately from the trenches 112. Alternatively, a gray mask pattern can be utilized to define the vias 114 and trenches 112 simultaneously in one photolithographic mask and etch step. The trenches 112 will form interconnect lines for the integrated circuit device while the vias 114 will form contacts to active areas of the integrated circuit.

Figure 1C:
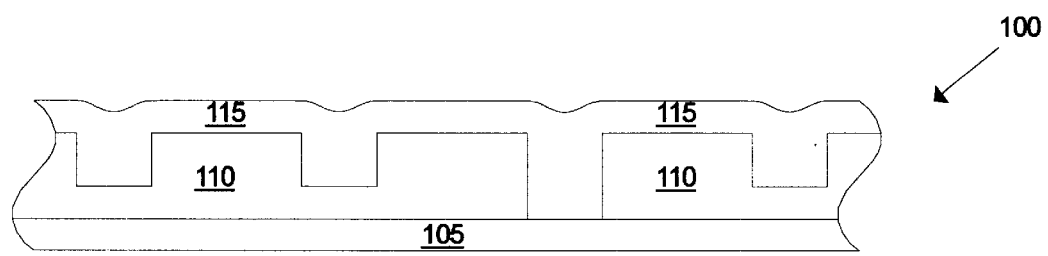

Following patterning of the insulating layer 110, a silver-containing metal layer 115 is formed overlying the substrate 105, filling the trenches 112 and vias 114 as shown in FIG. 1C. The metal layer 115 is generally formed as a blanket deposition in dual damascene techniques. This fills the trenches 112 and vias 114 by covering the entire surface of the insulating layer 110 with the metal layer 115. The metal layer 115 may be formed using chemical vapor deposition (CVD) or physical vapor deposition (PVD) techniques. Additionally, the metal layer 115 may be formed using electroplating techniques, such as forming a seed layer (not shown) overlying the insulating layer 110 and the exposed portions of the substrate 105 following by electroplating the remaining portion of the metal layer 115 onto the seed layer. Electroless plating is another example of a process that may be used to form the metal layer 115 covering the surface of the integrated circuit device 100. For one embodiment, the metal layer 115 is a silver alloy. For a further embodiment, the metal layer 115 is elemental silver (Ag).

As the dual damascene approach uses a contiguous metal layer 115 to fill the trenches 112 and vias 114, excess portions of the metal layer 115 must be removed from the surface of the insulating layer 110. Removal of the excess portions of the metal layer 115 generally involves some mechanical action, such as chemical-mechanical planarization (CMP). CMP is sometimes also referred to as chemical-mechanical polishing. As noted earlier, the process generally involves mechanical abrasion in the presence of a solution. The solution may carry abrasive particles or the abrasive particles may be supported by or suspended in an abrasive medium, such as an abrasive pad or belt. A commonly-used abrasive particle is aluminum oxide (alumina). Additional abrasive particles include silicon dioxide (silica), silicon carbide and cerium oxide (ceria). Other abrasive particles are known in the art. The solution may also carry solvents, oxidizers, reducers or etchants to chemically assist in the removal process, or it may simply be a carrier medium such as deionized (DI) water.

Figure 1D:
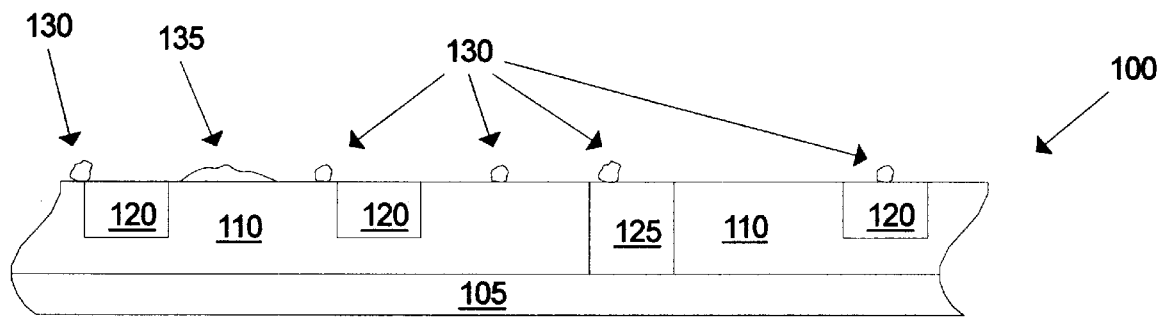

Following removal of the excess portions of the metal layer 115, the surface of the integrated circuit device 100 is cleaned to remove abrasive particles and other residuals resulting from mechanical removal techniques. These residuals can include residual particles 130 attracted to the surface of the integrated circuit device 100 as well as unremoved excess portions 135 of the metal layer 115 bonded to the surface of the integrated circuit device 100 as shown in FIG. 1D. The term residuals will hereinafter refer to all removal residue, whether it be unremoved portions 135 of the metal layer 115, or residual particles 130, including abrasive particles introduced by the removal process itself and particles of the removed surface material. Removal of the excess portions of the metal layer 115 defines interconnect lines 120 and contacts 125.

Removal of the excess portions of the metal layer 115 by mechanical action, whether chemically assisted or not, will result.in residuals on the surface that cannot easily be removed by a simple rinse, such as a DI water rinse. For the various embodiments, the residuals are substantially removed using a single post-CMP cleaning process to remove both attracted and bonded residuals. It is recognized that in the reality of industrial processing, some residuals will likely remain, regardless of the efficacy of the cleaning process. The various embodiments employ a "clean" solution for removing residuals. The cleaning solution is termed "clean" as it is substantially devoid of particulate material unlike an abrasive slurry that might be used in the mechanical removal process.

Residuals are removed from the surface of the integrated circuit device 100 by contacting the surface with a cleaning solution in accordance with the embodiments of the invention. Any method known in the art for using a liquid composition to assist in or otherwise facilitate removal of residuals may be used.

As one example, an integrated circuit device having residuals may be placed into a bath of the cleaning solution. The residuals will become suspended, dispersed and/or dissolved in the solution and the device surface will become relatively free of the residuals. Elevated temperature may be employed to hasten residual removal, although elevated temperature may also result in increased removal rates of non-residual materials, e.g., the dielectric layer 110, the interconnect lines 120 and the contacts 125.

Figure 1E:
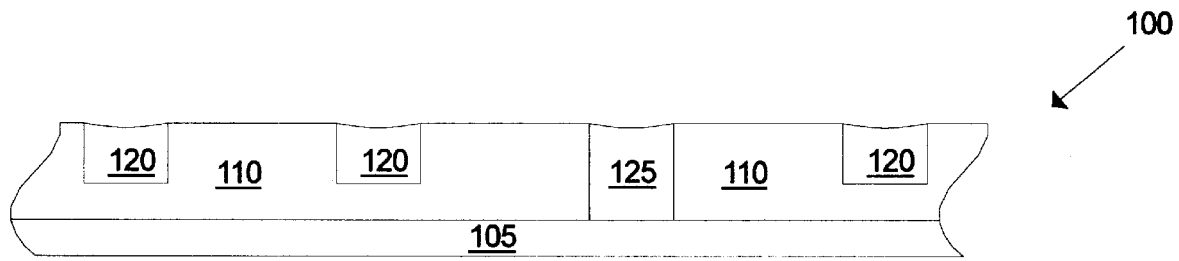

It is preferred that some mechanical action take place while the solution contacts the residual-containing device surface. Mechanical action facilitates improved removal of residuals from the device surface. For example, the bath of the cleaning solution may be circulated to produce movement of the solution across the surface of the device. Alternatively, or in addition, the bath may be an ultrasonic or megasonic bath (depending on the frequency of vibration). As another example, the solution may be sprayed onto the device surface, where the spray pressure assists in removing residuals from the device surface. As a further example, the device surface may be scrubbed, for example, by a brush in combination with the solution. Upon cleaning the surface of the integrated circuit device 100 with a solution in accordance with the various embodiments, the device may appear as shown in FIG. 1E with the surface substantially free of residuals such as residual particles 130 and unremoved portions 135. The interconnect lines 120 and the contacts 125 may be slightly recessed; the cleaning solution attacks the unremoved portions 135 on the surface of the integrated circuit device 100 and thus will also remove exposed portions of the interconnect lines 120 and contacts 125 if their composition is substantially the same.

The cleaning solution is an aqueous solution containing hydrogen peroxide ($H_2O_2$) and at least one acidic component. Each acidic component may be either a carboxylic acid or a salt of a carboxylic acid. Some examples of carboxylic acids include acetic acid ($CH_3COOH$), citric acid ($HOOCCH_2C(OH)(COOH)CH_2COOH \cdot H_2O$), lactic acid ($CH_3CH_2OCOOH$) and malic acid ($HOOCCH_2CH(OH)COOH$). To further the example, salts of these carboxylic acids include acetates, citrates, lactates and malates. Hydroxy acids and their salts are one preferred type of acidic component showing properties of both an alcohol and an acid. Hydroxy acids are a sub-class of carboxylic acids containing both a hydroxyl group (the univalent group —OH) and a carboxyl group (the univalent group —COOH).

For a further embodiment, the salt of a carboxylic acid is chosen to be an ammonium salt of a carboxylic acid. Ammonium salts of carboxylic acids are especially beneficial as they form self-buffered aqueous solutions. Examples of ammonium salts of carboxylic acids include ammonium acetate ($NH_4C_2H_3O_2$), dibasic ammonium citrate (($NH_4)_2HC_6H_5O_7$), ammonium lactate ($NH_4C_3H_5O_3$) and ammonium malate ($NH_4C_4H_5O_5$).

The cleaning solution should preferably be acidic, i.e., having a pH of less than 7. Acidic solutions will avoid excessive etching of silicon- or germanium-containing dielectric materials. For one embodiment, the cleaning solution contains approximately 0.01 to 1.0 wt % acidic components and 1 to 5 wt % of hydrogen peroxide in an aqueous solvent. The solvent may consist essentially of water. As is typical in integrated circuit fabrication, the solvent should be free of contaminants that could impart defects into the fabrication process. Accordingly, the solvent may consist essentially of deionized (DI) water or water that has been purified to remove suspended and dissolved contaminants. Purification of the water may include distilling the water or filtering the water and passing it through one or more ion exchange beds or columns. Alternatively, the solvent may contain water and one or more water-soluble organic solvents, e.g., alcohols or glycols. The cleaning solution may contain additional chemical components that do not materially affect the basic and novel properties of the solutions disclosed herein. Some examples include dyes, lubricants, stabilizers, buffers, surfactants, thickening agents, preservatives and antimicrobial agents.

For another embodiment, the cleaning solution contains approximately 0.05 to 0.2 wt % acidic components, such as dibasic ammonium citrate, and approximately 1 to 3 wt % of hydrogen peroxide in aqueous solution. For a further embodiment, the cleaning solution contains approximately 0.1 wt % acidic components and approximately 2 wt % of hydrogen peroxide inaqueous solution. Such solutions have been shown to be especially effective at removing residuals, both particulate and unremoved portions, resulting from planarization of excess silver from a glass surface using alumina abrasives. In particular, such cleaning solutions complex alumina to assist in removal of alumina particles and demonstrate a controlled etch of silver, providing desirable undercutting of the surface of the interconnect lines and contacts.

The various embodiments facilitate removal of particulate residuals and unremoved portions of a silver-containing metal layer using a single cleaning process. Such processing eliminates the need for a two-step approach of dispersing the particulate residuals in a first step and etching the unremoved metal on the device surface in a second step.

CONCLUSION

Cleaning solutions and methods for removing residuals from the surface of an integrated circuit device have been described. Such solutions and methods find particular application in the fabrication of a dual damascene structure following removal of excess portions of a silver-containing metal layer from a device surface. The cleaning solutions and methods facilitate removal of particulate residuals as well as unremoved portions of the metal layer in a single cleaning process. The cleaning solutions are dilute aqueous solutions containing hydrogen peroxide and at least one acidic component and are substantially free of particulate material. Acidic components include carboxylic acids and their salts.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. For example, other deposition techniques and mechanical removal techniques may be utilized with the invention. Accordingly, this application is intended to cover any adaptations or variations of the invention. It is manifestly intended that this invention be limited only by the following claims and equivalents thereof.

What is claimed is:

1. A method of removing residuals from a surface of an integrated circuit device following mechanical removal of a metal layer, the method comprising:
    contacting the surface of the integrated circuit device with a clean aqueous solution containing hydrogen peroxide and at least one acidic component selected from the group consisting of carboxylic acids and salts of carboxylic acids to remove both attracted and bonded residuals in a single cleaning process.

2. The method of claim 1, wherein the metal layer contains silver in a form selected from the group consisting of a silver alloy and elemental silver.

3. The method of claim 1, wherein an acidic component is selected from the group consisting of hydroxy acids and salts of hydroxy acids.

4. The method of claim 1, wherein each acidic component is selected from the group consisting of hydroxy acids and salts of hydroxy acids.

5. The method of claim 1, wherein the each acidic component is selected from the group consisting of acetic acid, citric acid, lactic acid, malic acid, a salt of acetic acid, a salt of citric acid, a salt of lactic acid and a salt of malic acid.

6. The method of claim 1, wherein the salts of carboxylic acids are ammonium salts of carboxylic acids.

7. A method of removing residuals from a surface of an integrated circuit device following mechanical removal of a silver-containing metal layer, the method comprising:
    contacting the surface of the integrated circuit device with an aqueous solution containing hydrogen peroxide and at least one acidic component selected from the group consisting of carboxylic acids and salts of carboxylic acids until the surface is substantially free of residuals;
    wherein the aqueous solution is substantially devoid of particulate material.

8. The method of claim 7, wherein the silver-containing metal layer contains a silver alloy.

9. The method of claim 7, wherein the silver-containing metal layer consists essentially of silver.

10. A method of removing residuals from a surface of an integrated circuit device following mechanical removal of a silver-containing metal layer, the method comprising:
    contacting the surface of the integrated circuit device with an acidic aqueous solution consisting essentially of hydrogen peroxide, water and at least one acidic component;
    wherein each acidic component is selected from the group consisting of carboxylic acids and salts of carboxylic acids; and
    wherein the surface of the integrated circuit device is contacted with the acidic aqueous solution until the surface is substantially free of attracted and bonded residuals.

11. A method of removing residuals from a surface of an integrated circuit device following mechanical removal of a silver-containing metal layer, the method comprising:
    contacting the surface of the integrated circuit device with an acidic aqueous solution consisting essentially of hydrogen peroxide, water and an acidic component to remove both attracted and bonded residuals using a single cleaning process;
    wherein the acidic component is selected from the group consisting of a carboxylic acid and a salt of a carboxylic acid.

12. A method of removing residuals from a surface of an integrated circuit device following mechanical removal of a silver-containing metal layer, the method comprising:
    contacting the surface of the integrated circuit device with a solution consisting essentially of hydrogen peroxide, an aqueous solvent and at least one acidic component to remove attracted and bonded residuals until the surface of the integrated circuit device is substantially free of such residuals;
    wherein each acidic component is selected from the group consisting of carboxylic acids and salts of carboxylic acids.

13. The method of claim 12, wherein the solution contains approximately 0.01 to 1.0 wt % acidic components and approximately 1 to 5 wt % hydrogen peroxide.

14. The method of claim 12, wherein the solution contains approximately 0.05 to 0.2 wt % acidic components and approximately 1 to 3 wt % hydrogen peroxide.

15. The method of claim 12, wherein the solution contains approximately 0.1 wt % acidic components and approximately 2 wt % hydrogen peroxide.

16. The method of claim 12, wherein the aqueous solvent consists essentially of water.

17. The method of claim 16, wherein the water is deionized water.

18. The method of claim 12, wherein the aqueous solvent contains water and at least one water-soluble organic solvent.

19. The method of claim 18, wherein each at least one water-soluble organic solvent is selected from the group consisting of alcohols and glycols.

20. The method of claim 12, wherein each acidic component is selected from the group consisting of hydroxy acids and salts of hydroxy acids.

21. The method of claim 12, wherein the solution has a pH of less than 7.

22. A method of fabricating an integrated circuit device, comprising:

forming a metal layer on a patterned insulating layer, wherein the metal layer covers at least a portion of a surface of the patterned insulating layer;

mechanically removing a portion of the metal layer from the surface of the patterned insulating layer, thereby forming residuals on the surface of the patterned insulating layer; and contacting the surface of the patterned insulating layer with a clean solution to remove residuals from the surface of the patterned insulating layer until the surface is substantially free of such residuals;

wherein the solution contains hydrogen peroxide, an aqueous solvent and at least one acidic component selected from the group consisting of carboxylic acids and salts of carboxylic acids.

23. The method of claim 22, wherein at least one acidic component is selected from the group consisting of hydroxy acids and salts of hydroxy acids.

24. The method of claim 22, wherein each at least one acidic component is selected from the group consisting of hydroxy acids and salts of hydroxy acids.

25. The method of claim 22, wherein each at least one acidic component is selected from the group consisting of acetic acid, citric acid, lactic acid, malic acid, ammonium acetate, dibasic ammonium citrate, ammonium lactate and ammonium malate.

26. The method of claim 22, wherein the metal layer contains silver in a form selected from the group consisting of a silver alloy and elemental silver.

27. A method of fabricating an integrated circuit device, comprising:

forming a silver-containing metal layer on a patterned surface of the integrated circuit device;

abrading the surface of the integrated circuit device with an alumina abrasive, wherein abrading the surface of the integrated circuit device leaves residuals on the surface of the integrated circuit device; and cleaning the residuals from the surface of the integrated circuit device until the surface is substantially free of the residuals using an aqueous solution containing hydrogen peroxide and an acidic component, wherein the acidic component is selected from the group consisting of a carboxylic acid and a salt of a carboxylic acid.

28. A method of fabricating an integrated circuit device, comprising:

forming a layer of silver on a patterned insulating layer, wherein the patterned insulating layer has apertures and wherein the layer of silver fills the apertures and covers a surface of the patterned insulating layer;

mechanically removing a first portion of the layer of silver overlying the surface of the patterned insulating layer, wherein a remaining portion of the layer of silver remains in the apertures; and removing residuals formed during mechanically removing the first portion of the layer of silver and removing a surface portion of the remaining portion of the layer of silver by contacting the surface of the patterned insulating layer with an aqueous solution containing hydrogen peroxide and at least one acidic component selected from the group consisting of carboxylic acids and salts of carboxylic acids;

wherein removing residuals occurs until the surface of the patterned insulating layer is substantially free of the residuals; and wherein removing the surface portion of the remaining portion of the layer of silver occurs until the surface of the patterned insulating layer is substantially free of the surface portion of the remaining portion of the layer of silver.

29. The method of claim 28, wherein the salts of carboxylic acids are ammonium salts of carboxylic acids.

30. The method of claim 28, wherein the salts of carboxylic acids are ammonium salts of hydroxy acids.

31. The method of claim 28, wherein the each acidic component is selected from the group consisting of acetic acid, citric acid, lactic acid, malic acid, an acetate, a citrate, a lactate and a malate.

* * * * *